(12) United States Patent
Ackermann et al.

(10) Patent No.: US 9,575,150 B2
(45) Date of Patent: Feb. 21, 2017

(54) HELIUM VAPOR MAGNETIC RESONANCE MAGNET

(75) Inventors: Robert Adolph Ackermann, Schenectady, NY (US); Richard Lawrence Frank, Ballston Lake, NY (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 405 days.

(21) Appl. No.: 14/233,642

(22) PCT Filed: Jul. 13, 2012

(86) PCT No.: PCT/IB2012/053605
§ 371 (c)(1),
(2), (4) Date: Jan. 17, 2014

(87) PCT Pub. No.: WO2013/011440
PCT Pub. Date: Jan. 24, 2013

(65) Prior Publication Data
US 2014/0159726 A1    Jun. 12, 2014

Related U.S. Application Data

(60) Provisional application No. 61/509,604, filed on Jul. 20, 2011.

(51) Int. Cl.
*G01V 3/00*      (2006.01)
*G01R 33/3815*   (2006.01)
(Continued)

(52) U.S. Cl.
CPC ....... *G01R 33/3815* (2013.01); *G01R 33/3802* (2013.01); *H01F 6/04* (2013.01); *H01F 6/06* (2013.01); *Y10T 29/49071* (2015.01)

(58) Field of Classification Search
USPC .......................................... 324/309
See application file for complete search history.

(56) References Cited

U.S. PATENT DOCUMENTS 3,427,391 A * 2/1969 Stekly ........................ H01F 6/06
174/125.1
3,801,942 A * 4/1974 Elsel ......................... H01F 6/06
174/15.4
(Continued)

FOREIGN PATENT DOCUMENTS

JP        6213010 A    1/1987
JP         053120 A    1/1993
(Continued)

*Primary Examiner* — Rodney Fuller

(57) ABSTRACT

A magnetic resonance magnet assembly 20 has a coil form 70 shaped as a hollow cylinder. At least two thermally conductive sheets 60 are disposed circumferentially around the coil form 70, separated by a non-electrically conductive region 90. Thermally conductive tubing 50 affixed to each thermally conductive sheeting section 60 runs circumferentially around the coil form 70. At least one layer of thermally conductive electrically insulating material 110 such as fiber glass is bonded with a thermally conductive epoxy encapsulant to the thermally conductive sheets 60. A winding of superconductive wire 80 is bond together and to the electrically insulating material 110 with the thermally conductive epoxy encapsulant.

17 Claims, 5 Drawing Sheets

(51) Int. Cl.
*H01F 6/04* (2006.01)
*G01R 33/38* (2006.01)
*H01F 6/06* (2006.01)

(56) References Cited

U.S. PATENT DOCUMENTS

| | | | |
|---|---|---|---|
| 4,726,199 A | 2/1988 | Takano | |
| 5,461,873 A | 10/1995 | Longsworth | |
| 6,622,494 B1* | 9/2003 | Pourrahimi | H01F 6/04 62/259.2 |
| 6,725,683 B1* | 4/2004 | Laskaris | F17C 3/08 165/104.21 |
| 2007/0120630 A1* | 5/2007 | Huang | G01R 33/3815 335/216 |
| 2008/0209919 A1 | 9/2008 | Ackermann | |
| 2010/0295642 A1 | 11/2010 | Hahn | |
| 2011/0179809 A1* | 7/2011 | Zhang | G01R 33/3804 62/51.1 |
| 2012/0122697 A1* | 5/2012 | Miyazaki | H01F 6/06 505/211 |
| 2014/0107468 A1* | 4/2014 | Calvert | A61B 5/055 600/411 |
| 2014/0243205 A1* | 8/2014 | Ackermann | F25B 25/005 505/162 |
| 2016/0172089 A1* | 6/2016 | Calvert | H01F 6/06 335/216 |

FOREIGN PATENT DOCUMENTS

| | | |
|---|---|---|
| JP | 09306723 A | 11/1997 |
| JP | 2007214466 A | 8/2007 |
| JP | 2011125686 A | 6/2011 |
| WO | 2006122594 A1 | 11/2006 |

* cited by examiner

HELIUM VAPOR MAGNETIC RESONANCE MAGNET

CROSS-REFERENCE TO PRIOR APPLICATIONS

This application is the U.S. National Phase application under 35 U.S.C. §371 of International Application No. PCT/IB2012/053605, filed on Jul. 13, 2012, which claims the benefit of U.S. Provisional Patent Application No. 61/509,604, filed on Jul. 20, 2011. These applications are hereby incorporated by reference herein.

The present application relates to magnetic resonance magnets, cryomagnets, superconducting magnets, and specifically to the cooling of those types of magnets.

Magnetic resonance (MR) scanners use superconducting magnets, which are cooled to a superconducting temperature, e.g. less than 5.2° Kelvin. Traditionally liquid Helium has been used to cool superconductive magnets because of its thermal properties. However, liquid Helium is expensive. Many areas of the world do not have a ready supply of liquid Helium or replacement liquid Helium.

The electrical and magnetic properties of the magnet are maintained while cooling the magnet to produce a uniform static magnetic field of a magnetic resonance system. Cooling systems uniformly cool the coil without invading the integrity of the magnetic coil.

The bore of the magnet coil used for whole body MR imaging is large enough to accommodate a patient to be imaged as well as the structures which thermally separate the patient from the extreme cold temperature of the cryogenic system. Manufacturing designs accommodate a room temperature in the bore of the coil assembly while maintaining a operating temperature in the surrounding magnet below the critical temperature of the magnet. A room temperature of 70° F. is approximately 294° K, while the critical temperature of the magnet is typically below 5.2° K. This extreme temperature difference creates design and manufacturing complexities.

The present application provides a new and improved Helium vapor magnetic resonance magnet which overcomes the above-referenced problems and others.

In accordance with one aspect, a magnetic resonance magnet has a coil form, thermally conductive sheets, thermally conductive tubing sections, at least one layer of thermally conductive electrically insulating material, and a winding of superconductive wire. The coil form is shaped as a hollow cylinder. At least two thermally conductive sheets extend circumferentially on the coil form, separated by non-electrically conductive regions. A thermally conductive tubing section is thermally connected to each thermally conductive sheet. At least one layer of thermally conductive electrically insulating material is disposed around and bonded to the thermally conductive sheets. A winding of superconductive wire is disposed around and bonded together and to the electrically insulating material.

In accordance with another aspect, a magnetic resonance magnet system includes at least one magnet assembly, Helium vapor which as it flows through the thermally conductive tubing around the coil cools the coil below the critical superconducting magnet temperature, and a refrigerator heat exchanger connected to the tubing which cools the Helium vapor. A magnet assembly has a coil form, thermally conductive sheets, thermally conductive tubing sections, at least one layer of thermally conductive electrically insulating material, and a winding of superconductive wire. The coil form is shaped as a hollow cylinder. At least two thermally conductive sheets extend circumferentially on the coil form, separated by non-electrically conductive regions. A thermally conductive tubing section is connected to each thermally conductive sheet. At least one layer of thermally conductive electrically insulating material is disposed around and bonded to the thermally conductive sheets. A winding of superconductive wire is disposed around and bonded together and to the electrically insulating material.

In accordance with another aspect, a magnetic resonance imaging or spectroscopy system includes a magnetic resonance magnet system, a gradient coil, a gradient amplifier, a radio frequency coil, a transmitter, a transmitter, a receiver, and a processor. The magnetic resonance magnet system has at least one magnet assembly, Helium vapor which as it flows through the thermally conductive tubing around the coil cools the coil below the critical superconducting magnet temperature, and a refrigerator heat exchanger connected to the tubing which cools the Helium vapor. A magnet assembly has a coil form, thermally conductive sheets, thermally conductive tubing sections, at least one layer of thermally conductive electrically insulating material, and a winding of superconductive wire. A gradient coil is located within a bore of the magnetic resonance magnet system. A gradient amplifier is connected to the gradient coil. A radio frequency coil is located inside the gradient coil. A transmitter is connected to the radio frequency coil. A receiver is connected to the radio frequency coil which receives the RF signals. A controller connects to the gradient amplifier and to the transmitter and controls the gradient amplifier and transmitter to excite resonance in a subject. A processor is connected to the receiver and to the controller and processes received resonance signals into an image and/or spectroscopic information.

In accordance with another aspect, a method of manufacturing a magnetic resonance magnet includes forming a cylindrical coil form. Thermally conductive tubing section is connected to thermally conductive sheets. At least one layer of electrically insulating material is bonded to the thermally conductive sheets. Superconductive wire is wound around the electrically insulating material and bonds the superconductive wire together and to the electrically insulating material.

In accordance with another aspect, a method of magnetic resonance imaging includes generating a static $B_0$ magnetic field in an imaging region using a helium vapor cooled magnet assembly manufactured as discussed above. Gradient magnetic fields are generated in the imaging region. An RF field is transmitted into the imaging region. Magnetic resonance signals are received from the imaging region. An image is reconstructed from the received magnetic resonance signals.

One advantage resides in the reduced volumes of helium.

Another advantage is that helium vapor is used to cool the magnet instead of liquid helium.

Another advantage is the simple and thermally efficient method of attaching heat exchanger plates to the coils without affecting either the coil's fabrication or the electrical performance.

Another advantage is the simplicity of flow of Helium vapor through the system and the ability to uniformly cool the magnet coil.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
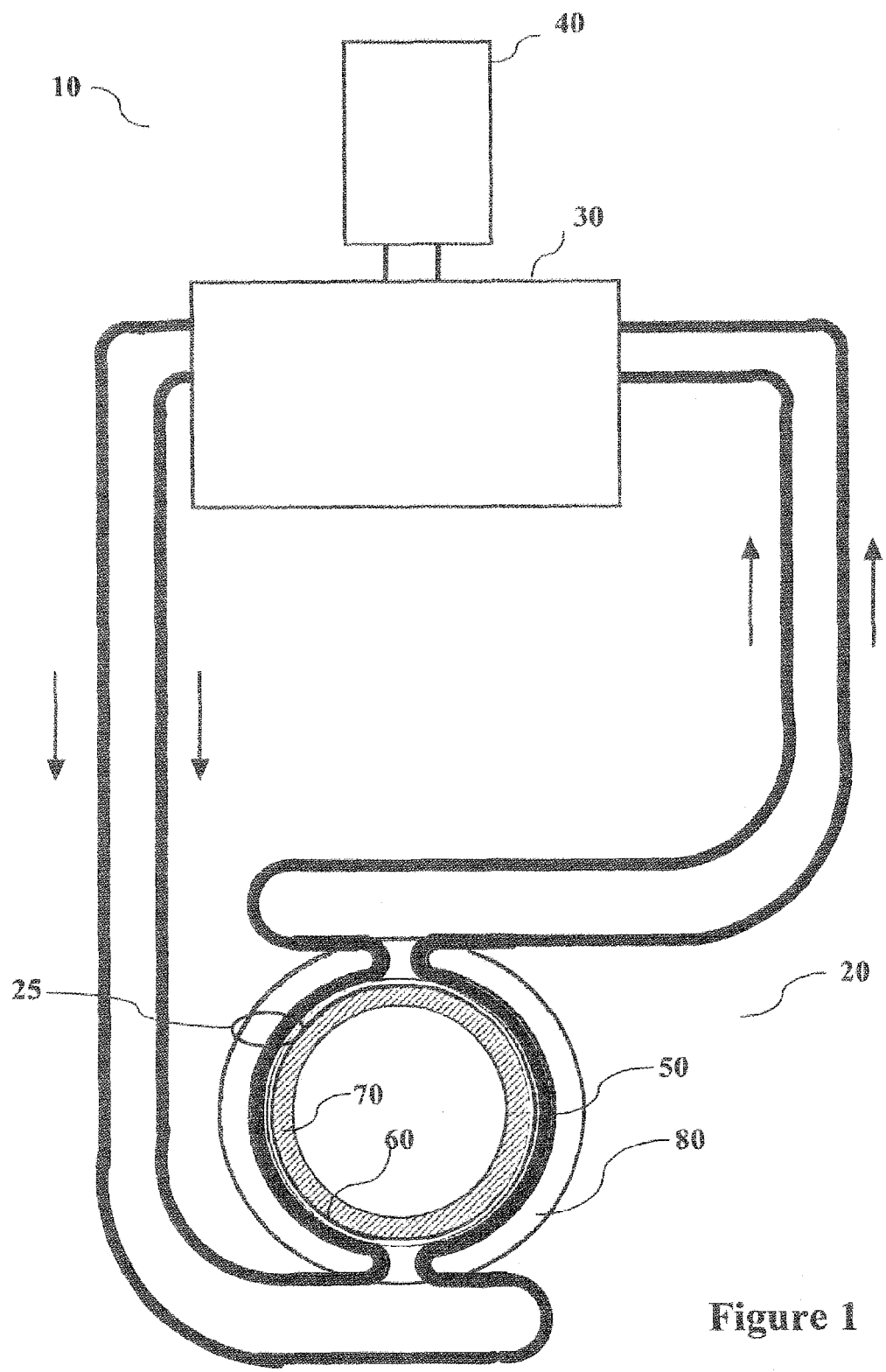
FIG. 1 is diagram showing one embodiment of a Helium vapor magnetic resonance magnet system.

With reference to FIG. 1, an embodiment of a magnetic resonance (MR) magnet in a closed loop system 10 is shown. The closed loop system 10 includes circulating Helium vapor which is heated by an MR magnet assembly 20 and cooled by a refrigerator heat exchanger 30 with an associated cryogenic refrigerator 40, and recirculated to the magnet assembly 20. A suitable refrigerator heat exchanger with associated cryogenic refrigerator is described in US 2008/0209919.

The cooled Helium gas enters the magnet assembly 20 at the bottom and flows up a thermally conductive tubing 50 attached to thermally conductive sheets 60 or plates interior to the magnet. The Helium vapor is cooled in the heat exchanger 30 to approximately 4.2° K, which provides a 1° K margin below the critical temperature of the magnet. The cold gas from the refrigerator heat exchanger 30 is relatively dense but becomes less dense as it is warmed by the magnet assembly 20, producing a downward flow of denser helium gas from the refrigerator heat exchanger 30 to the bottom of the magnet and an upward flow of less dense warmer helium gas through the magnet and back to the refrigerator heat exchanger. The magnet assembly 20 is mounted on a coil form 70.

When manufactured, a coil assembly 25 is created using a winding fixture and then mounted on a coil form 70 or manufactured directly onto the coil form 70. Multiple coils 25 of varying widths are typically used in a MR system. Each coil assembly 25 is mounted on a corresponding coil form 70. The width of a coil 25 affects a number of windings and a strength of the magnetic field generated. The coils manufactured with the process described below vary in size, e.g. up to about 300 mm in width. The coil form 70 is manufactured from a structural metal, such as stainless steel, formed in a hollow cylinder.

As the Helium vapor travels up the tubing 50 heat is absorbed. Heat is generated by the coil assembly 25, and conductively transferred through thermally conductive plates 60 to the thermally conductive tubing 50 and absorbed by the Helium vapor. Good thermal conduction between all components of the magnetic assembly ensures a uniform operating temperature.

Figure 2:
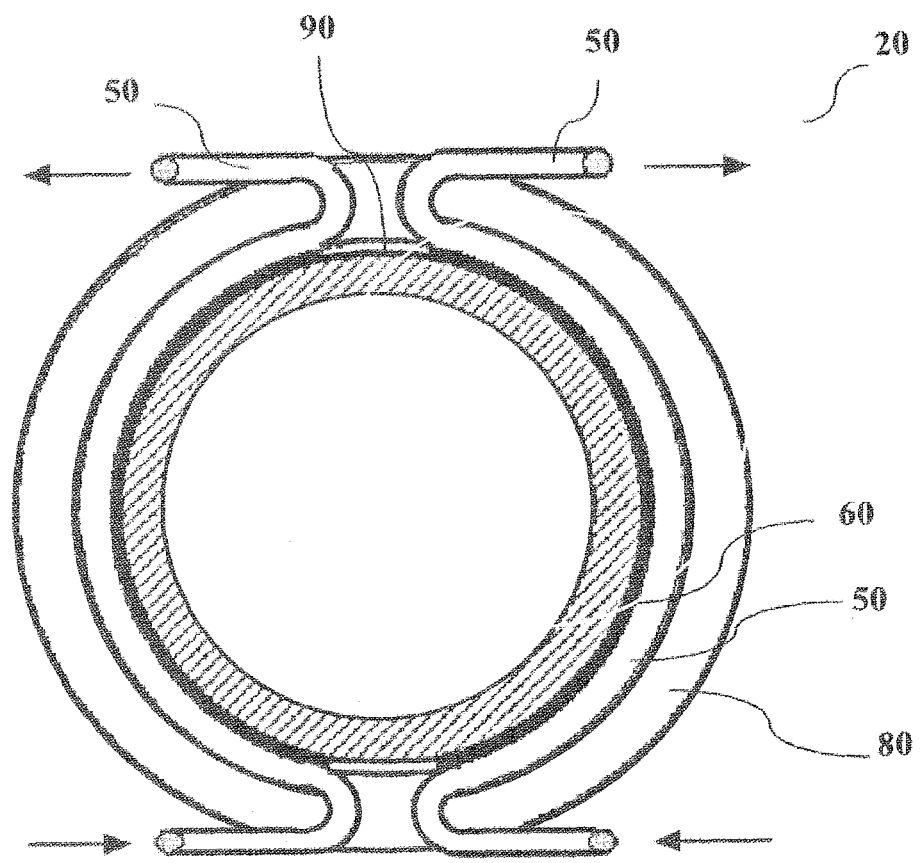
FIG. 2 is diagram showing one embodiment of an enlarged view of a magnet.

With reference to FIG. 2, an enlarged view of one embodiment of the magnet assembly 20 is shown. Two sections of thermally conductive sheeting 60 are electrically isolated by a non-electrically conductive spacer 90. The region between the sheets 60 prevents circumferential currents in the thermally conductive sheeting 60 which would interfere with the operation of the MR system. The thermally conductive sheets are made, for example, of copper approximately 0.3 mm in thickness. Aluminum and other thermally conductive materials can also be used for the sheeting 60. The space between the thermally conductive sheets 60 is approximately 6 mm which is filled with the non-electrically conductive spacer 90, e.g. a plastic filler strip. The non-electrically conductive spacer 90 provides a uniform surface on which to wind the coil. The sheets are bent to the circumference of the coil form 70, or if a winding fixture is used during the manufacturing process to the outside diameter of the winding fixture.

Thermally conductive tubing 50 is thermally and mechanically affixed to the thermally conductive sheets 60. An example is 9-10 mm OD refrigerator grade copper tubing. Other materials with good thermal conduction may be used such as aluminum. The size of the tubing 50 is large enough that the pressure drop in the tubing is small. With smaller diameter tubing more friction is created, and a drop in cooling capacity results. With tubing that is too small, there is greater non-uniform cooling of the magnet.

Figure 3:
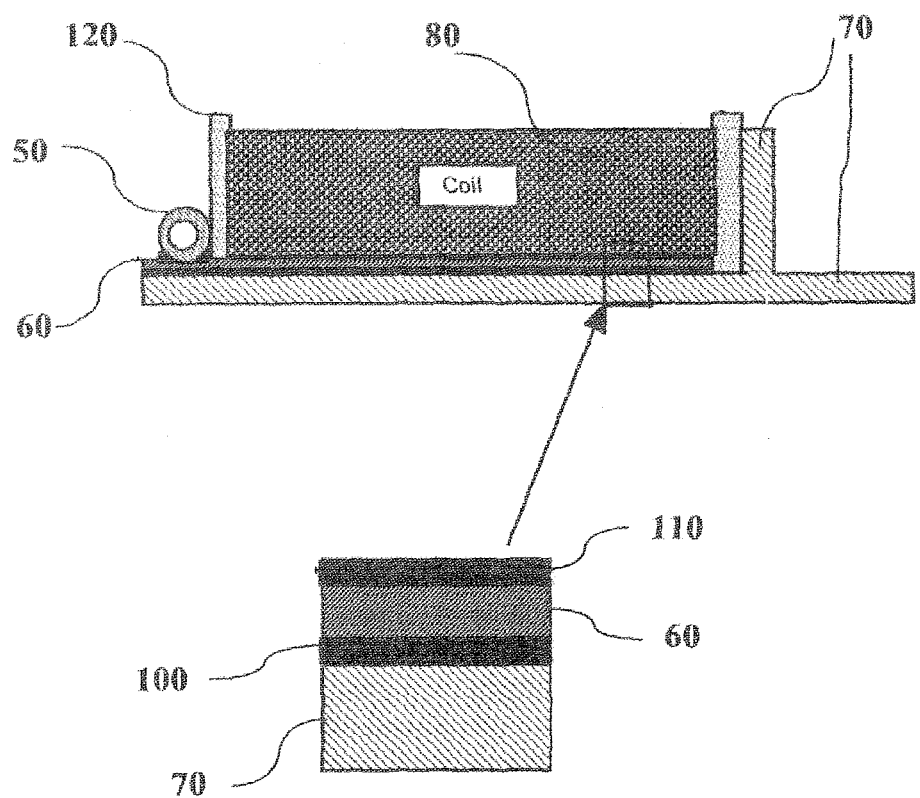
FIG. 3 is diagram showing a cross section of one embodiment of a magnetic resonance magnet with an exploded view.
Figure 4:
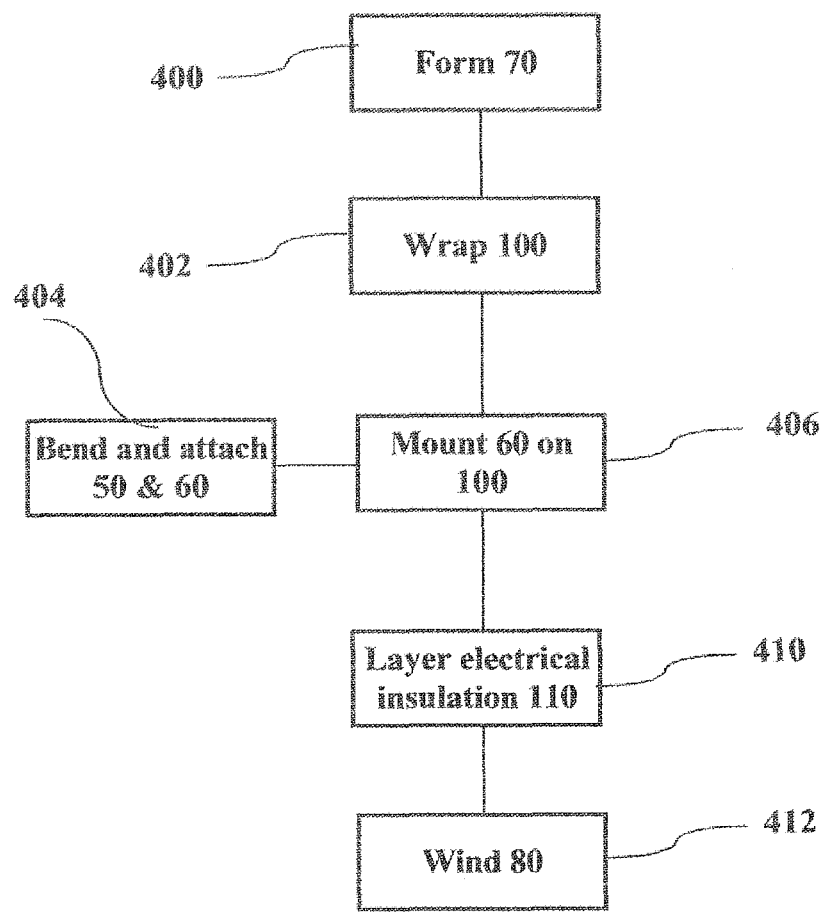
FIG. 4 is a flowchart illustrating a method of manufacturing a coil assembly.

With reference to FIGS. 3 and 4, in a step 400, the coil form 70 is fabricated, e.g. machined from stainless steel.

In a step 402, an insulating material 100 is wrapped around the coil form 70 or a winding fixture (not shown) if used to manufacture the magnet coil. An example of the insulating material 100 is a layer of polytetrafluoroethylene, commonly known as TEFLON™, sandwiched between layers of metalized polyester, commonly found as MYLAR™. The insulation layer 100 allows movement between coil form 70 and sheeting 60 while minimizing friction.

In a step 404, the thermally conductive tubing 50 is soldered or welded to the sheets 60 and the sheets and tubing are bent to the radius of the coil form. The tubing 50 may be attached prior to the bending of the sheets 60 or can be bent first and the thermally conductive sheets and tubing attached in their bent state. In a step 406 the thermally conductive sheet 60 and tubing is position over the insulating layer 100. The thermally conductive sheet 60, preferably, is not affixed to the electrically insulating sheet to accommodate thermal expansion/contraction differences. The electrically insulating spacers 90 are positioned on the electrically insulating material 100 between the thermally conductive sheets and the top and bottom of the coil assembly. The sheeting 60 is cleaned to remove any oxide present to provide for a thermally conductive bond.

In a step 410, over the thermally conductive sheeting 60 is placed a layer of electrical insulation 110 which is thermally conductive. Electrically insulating spacers 120 are disposed on either side of where the coil is to be wound. Flanges may be added to the coil form 70 when formed to limit movement of the sheeting 60 during operation of the magnet 20 and to affix coverings and other structural components. If a flange is present, then the electrically insulating spacer is placed between the flange and the sheeting 60 prior to wrapping in step 402. The layer of electrical insulation 110 is applied after cleaning the sheeting. A thermally conductive, electrically insulating epoxy encapsulant is applied, followed by a layer of material 110 which electrically insulates the coil from the thermally conductive sheets 60, allows good thermal conductivity, and binds with the epoxy. A suitable material 100 is bi-directional fiber glass cloth with a surface treatment to improve bonding with the epoxy. Both sides of the fiber glass material 110 are coated with the epoxy to provide strong bonding and good thermal conduction and the fiber glass material is wrapped around the thermal conductive sheet 60. The process can be repeated with more epoxy coatings and fiber glass material 110 to ensure that any irregularities are taken up and provide structural rigidity. Other thin flexible materials which provide electrical insulation, and permit coating and saturation of the epoxy encapsulant are also contemplated.

In a step 412, the superconducting wire 80 is wound around the layer of encapsulated fiber glass material 110 before the epoxy dries. As each layer of wire is wound, additional thermally conductive epoxy encapsulant is applied to securely bond the wire coil 80 together and to the layer of electrically insulating material 110 which is in turn bonded to the thermally conductive sheets 60. All the interstitial spaces in the wire coil 80 are filled with epoxy encapsulate to ensure a strong and thermally efficient bond with the sheets 60. The epoxy, the sheets 60, and the tubing 50 act as efficient heat exchangers. The thickness of the wire coil 80 is dictated by the magnetic field to be generated and is generally 2.5-5 cm. The mechanical bond of the coil assembly 25 or coil should withstand liftoff or hoop forces when current is applied. The thermally conductive sheets 60 bonded to the coil winding with an epoxy have a high peel strength and good thermal conductivity.

Figure 5:
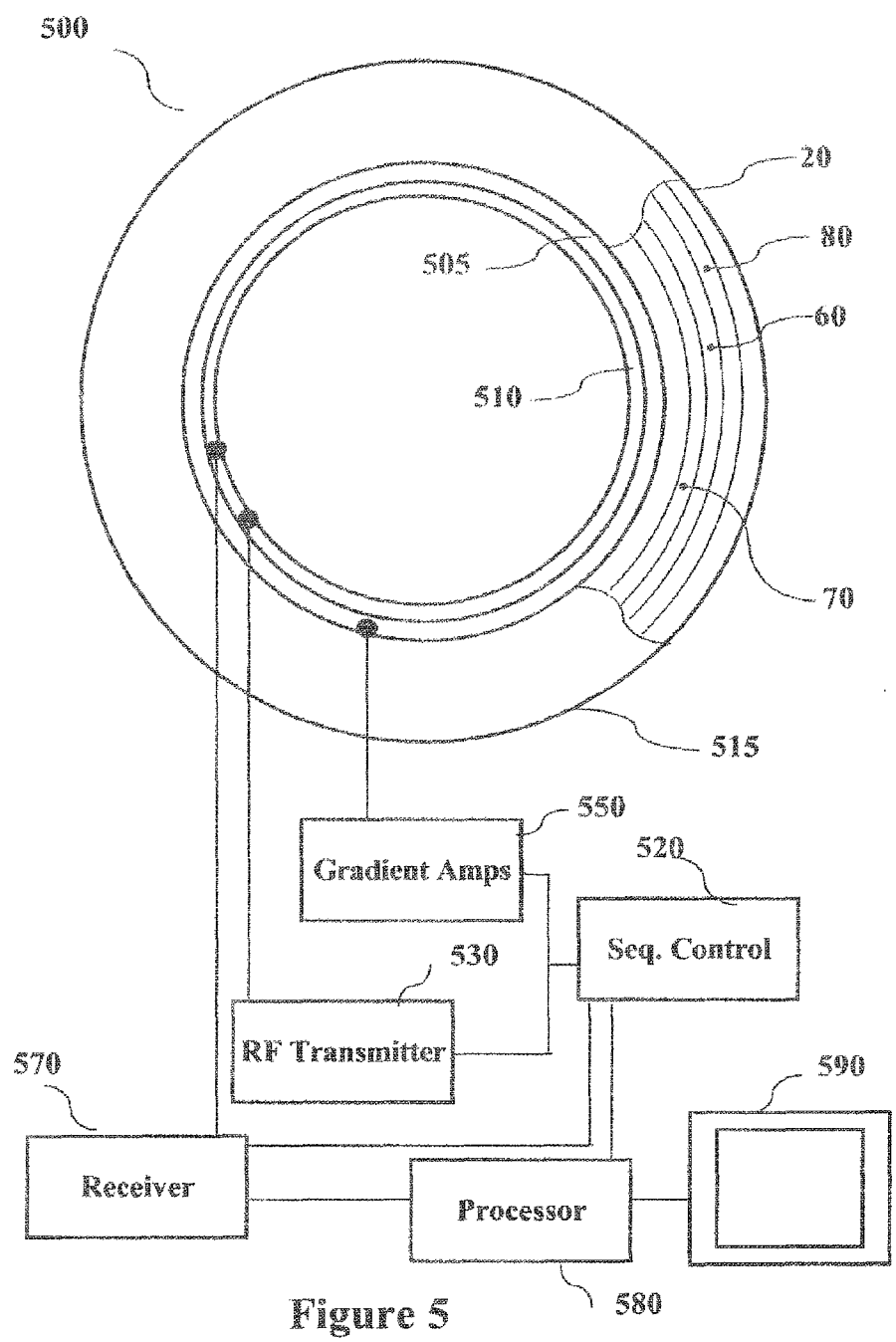
FIG. 5 is a diagram illustrating an embodiment of a MR system with a cut-away view of a vacuum dewar showing a magnetic resonance magnet.

With reference to FIG. 5, operational components of an embodiment of a MR system 500 are shown. A vacuum dewar 515 contains the magnet assembly 20 which generates a static $B_0$ field during operation. The covering of vacuum dewar attaches, e.g., using the flange previously described, and encloses the coil form 70, sheets 60, and coil winding 80. A gradient coil 505 and a radio frequency (RF) coil 510 are concentrically located within the bore of the vacuum dewar. The gradient coil 505 generates gradient $G_x$, $G_y$, $G_z$ magnetic fields powered by a gradient amplifier 550 during the imaging process. The gradient magnetic fields are generated under control of a sequence control 520. The illustrated RF coil 510 is a whole body coil which transmits a $B_1$ magnetic field when turned on by an RF transmitter 530. The sequence control 520 determines when the RF coil 510 operates in a transmit mode and when the RF coil 510 operates in a receive mode. When in the receive mode, a receiver 570 demodulates the RF signals. The RF signals are then reconstructed by a processor 580 and may displayed as an image on an output device 590 or stored for other access.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A superconductivity magnet assembly comprising:
    a coil form shaped as a hollow cylinder;
    at least two thermally conductive sheets extending circumferentially on the coil form, and separated by non-electrically conductive regions;
    thermally conductive tubing sections thermally connected to the thermally conductive sheets;
    at least one layer of thermally conductive electrically insulating material disposed around and bonded to the thermally conductive sheets; and
    a winding of superconductive wire disposed around and bonded together and to the electrically insulating material, forming a thermally efficient unitary structure.

2. The magnet assembly according to claim 1, further including:
    a layer of insulating material such as at least a layer of polytetrafluoroethylene, and a layer of metalized polyester, disposed between the coil form and the thermally conductive sheeting to minimize friction and allow the thermally conductive sheets to move relative to the coil form.

3. The magnet assembly according to claim 1, further including:
    a non-electrically conductive material spacer disposed between adjacent ends of the thermally conductive sheets.

4. The magnet assembly according to claim 1, wherein the electrically insulating material is flexible.

5. The magnet assembly according to claim 1, wherein the electrically insulating material includes fiberglass.

6. The magnet assembly according to claim 1, wherein the electrically insulating material is saturated with a thermally conductive epoxy encapsulant.

7. The magnet assembly according to claim 1, wherein the electrically insulating material includes:
    a plurality of layers of woven material, the woven material, the superconductive wire being bonded into a unitary construction by a thermally conductive epoxy encapsulant, which unitary construction is supported by and not bonded to the coil form.

8. The magnet assembly according to claim 1 wherein one of the thermally conductive sheets and the thermally conductive tubing sections thermally connected thereto extend from adjacent a bottom of the coil form circumferentially around one side of the coil form to adjacent a top of the coil form and another of the thermally conductive sheets and the thermally conductive tubing sections thermally connected thereto extend from adjacent the bottom of the coil form circumferentially around an opposite side of the coil form to adjacent the top of the coil form.

9. A magnetic resonance magnet system comprising:
    at least one magnet assembly according to claim 1;
    Helium vapor which as it flows through the thermally conductive tubing around the magnet assembly to cool the superconducting wire below its superconducting temperature; and
    a refrigerator heat exchanger connected to the thermally conductive tubing section which cools the Helium vapor.

10. A magnetic resonance imaging or spectroscopy system comprising:
    the magnetic resonance magnet system according to claim 9;
    a gradient coil located in a bore of the magnetic resonance magnet system;
    a gradient amplifier connected to the gradient coil;
    a radio frequency coil located inside the gradient coil;
    a transmitter connected to the radio frequency coil;
    receiver which receives magnetic resonance signals;
    a controller connected to the gradient amplifier and to the transmitter; and
    a processor connected to the receiver and to the controller, the processor processing the received magnetic resonance signals into an image and/or spectroscopic information.

11. A method of manufacturing a magnetic resonance magnet comprising:
    forming a cylindrical coil form;
    thermally connecting a thermally conductive tubing to thermally conductive sheets;
    positioning the thermally conductive sheets with the connected thermally conductive tubing sections circumferentially around the coil form;
    bonding at least one layer of electrically insulating, thermally conductive material to the thermally conductive sheets; and winding superconductive wire around the electrically insulating material and bonding the superconductive wire together and to the electrically insulating material.

12. The method according to claim 11, further including:
applying a layer of insulating material such as polytetrafluoroethylene sandwiched by metalized polyester over the coil form which minimizes friction with and allows the thermally conductive sheets to move relative the coil form.

13. The method according to claim 11, further including:
bonding the thermally conductive sheets, the electrically insulating material, and the superconducting wire into a unitary structure by:
    impregnating the electrically insulating material with a thermally efficient epoxy encapsulant; and
    filling the interstitial spaces surrounding the superconductive wire as each layer is wound with the thermally conductive epoxy encapsulant.

14. The method according to claim 11, wherein positioning the thermally conductive sheets includes:
    positioning one of the thermally conductive sheets and the thermally conductive tubing sections thermally connected thereto to extend from adjacent a bottom of the coil circumferential around one side of the coil form to adjacent a top of the coil form; and
    positioning another of the thermally conductive sheets and the thermally conductive tubing sections thermally connected thereto to extend from adjacent the bottom of the coil form circumferential around an opposite side of the coil form to adjacent the top of the coil form.

15. The method according to claim 11, further including:
connecting the thermally conductive tubing with the refrigerator heat exchanger allowing helium vapor to circulate between the thermally conductive tubing and the refrigerator heat exchanger.

16. A method of magnetic resonance imaging comprising:
manufacturing a magnetic resonance magnet according to claim 11;
generating a static $B_0$ magnetic field through an imaging region using the magnetic resonance magnet;
generating gradient magnetic fields across the imaging region;
transmitting RF fields into the imaging region;
receiving magnetic resonance signals from the imaging region; and
reconstructing an image from the received magnetic resonance signals.

17. A method of manufacturing a magnetic resonance magnet comprising:
attaching thermally conductive tubing sections to thermally conductive sheets;
before or after the attaching step, bending the thermally conductive sheeting and the thermally conductive tubing sections to conform to a circumference of a winding fixture or form;
covering the winding fixture or form with a layer of insulating material;
placing the bent thermally conductive sheets with attached thermally conductive tubing sections over the insulating material;
adding spacers and insulator segments around the bent thermally conductive sheets with attached thermally conductive tubing;
bonding at least one layer of electrically insulating material to the bent thermally conductive sheeting sections with a thermally conductive epoxy encapsulant; and
before the thermally conductive epoxy encapsulant cures, winding superconductive wire around the electrically insulating material and bonding the superconductive wire together and to the electrically insulating material with the thermally conductive epoxy encapsulant to form a coil assembly.

* * * * *